(12) United States Patent
Savtchouk et al.

(10) Patent No.: US 6,680,621 B2
(45) Date of Patent: *Jan. 20, 2004

(54) STEADY STATE METHOD FOR MEASURING THE THICKNESS AND THE CAPACITANCE OF ULTRA THIN DIELECTRIC IN THE PRESENCE OF SUBSTANTIAL LEAKAGE CURRENT

(75) Inventors: Alexander Savtchouk, Tampa, FL (US); Jacek Lagowski, Tampa, FL (US); John D'amico, Temple Terrace, FL (US); Marshall D. Wilson, Tampa, FL (US); Lubomir L. Jastrzebski, Clearwater, FL (US)

(73) Assignee: Semiconductor Diagnostics, Inc., Tampa, FL (US)

( * ) Notice: Subject to any disclaimer, the term of this patent is extended or adjusted under 35 U.S.C. 154(b) by 53 days.

This patent is subject to a terminal disclaimer.

(21) Appl. No.: 09/851,291

(22) Filed: May 8, 2001

(65) Prior Publication Data

US 2002/0125900 A1 Sep. 12, 2002

Related U.S. Application Data

(63) Continuation-in-part of application No. 09/810,789, filed on Mar. 16, 2001.
(60) Provisional application No. 60/264,571, filed on Jan. 26, 2001.

(51) Int. Cl.[7] .......................... G01R 31/26; G01N 27/00
(52) U.S. Cl. ....................... 324/765; 324/767; 324/455; 324/71.1
(58) Field of Search .................................. 324/765, 767, 324/455, 158.1, 678, 71.1, 71.6, 452

(56) References Cited

U.S. PATENT DOCUMENTS

| | | | | |
|---|---|---|---|---|
| 3,290,179 A | * | 12/1966 | Goulding | 438/10 |
| 3,840,809 A | * | 10/1974 | Yun | 324/158.1 |
| 3,995,216 A | * | 11/1976 | Yun | 324/765 |
| 5,216,362 A | * | 6/1993 | Verkuil | 324/158.1 |
| 5,453,703 A | * | 9/1995 | Goldfarb | 324/765 |
| 5,646,074 A | * | 7/1997 | Chen et al. | 437/239 |
| 6,011,404 A | * | 1/2000 | Ma et al. | 324/765 |
| 6,097,196 A | | 8/2000 | Verkuil et al. | |
| 6,202,029 B1 | | 3/2001 | Verkuil et al. | |

FOREIGN PATENT DOCUMENTS

WO     WO 93/14411     *   7/1993     ........... G01R/31/12

OTHER PUBLICATIONS

Schroder, Dieter; "Surface voltage and surface photovoltage: history, theory and applications" Meas. Sci. Tech. 12, p:R16–R31 (2001).

* cited by examiner

Primary Examiner—Kamand Cuneo
Assistant Examiner—Paresh Patel
(74) Attorney, Agent, or Firm—Fish & Richardson P.C.

(57) ABSTRACT

A method is described for measuring the capacitance and the equivalent oxide thickness of an ultra thin dielectric layer on a silicon substrate in which the dielectric layer is uniform or patterned. The surface of a dielectric layer is electrically charged by a flux on ions from a corona discharge source until a steady state is reached when the corona flux is balanced by the leakage current across a dielectric. The flux is abruptly terminated and the surface potential of a dielectric is measured versus time. The steady state value of the surface potential is obtained by extrapolation of the potential decay curve to the initial moment of ceasing the corona flux. The thickness of a dielectric layer is determined by using the steady state potential or by using the value of the surface potential after a predetermined time.

62 Claims, 11 Drawing Sheets

STEADY STATE METHOD FOR MEASURING THE THICKNESS AND THE CAPACITANCE OF ULTRA THIN DIELECTRIC IN THE PRESENCE OF SUBSTANTIAL LEAKAGE CURRENT

CROSS-RELATED APPLICATIONS

This application is a continuation-in-part of application Ser. No. 09/810,789, filed Mar. 16, 2001, now pending, and under 35 USC §119(e)(1), claims the benefit of provisional application Ser. No. 60/264,571, filed Jan. 26, 2001.

BACKGROUND

The invention relates to semiconductor wafer testing and more particularly to characterizing the thickness and capacitance of a dielectric layer on a semiconductor wafer in the presence of substantial leakage current.

As is known in the art, semiconductor devices often contain dielectric layers (e.g., silicon dioxide) grown/or deposited on a semiconductor substrate (e.g., silicon). Semiconductor wafers including dielectric layers are used in manufacturing microelectronic devices such as metal-oxide-semiconductor (MOS) capacitors, MOS-field effect transistors (MOSFET), and related integrated circuits.

During manufacture of microelectronic devices, the thickness of the dielectric layer must be frequently monitored with high precision. Typically, the dielectric thickness is measured by optical or electrical methods. Optical ellipsometric methods for determining a dielectric thickness are described for example in U.S. Pat. No. 5,343,293 and the references therein. An electrical method for determining the thickness of a dielectric utilizes capacitance measurements of MOS capacitors fabricated, for test purposes, on the dielectric layer. Once measured, the capacitance can be used to calculate an "equivalent oxide thickness" (EOT), i.e. the thickness of a $SiO_2$ layer that would produce the same measured capacitance. In other electrical methods, the dielectric thickness can be determined without fabricating MOS test capacitors by charging the surface of the dielectric layer with a corona discharge and measuring the resulting surface potential of the charged dielectric layer with a Kelvin or a Monroe probe. These techniques are discussed, for example, in U.S. Pat. No. 6,037,797, to J. Lagowski et.al. In this method a known electric charge $\Delta Q_C$ is placed on the surface of a dielectric layer (for example, on the surface of a $SiO_2$ layer on a silicon wafer) by a precisely calibrated corona discharge source. The dielectric layer thickness can be determined from the value of $\Delta Q_C/\Delta V$ where $\Delta V$ is the change of the dielectric surface potential caused by the charge $\Delta Q_C$.

Due to substantial leakage of current across the dielectric layer, via tunneling, the method described in U.S. Pat. No. 6,037,797 is ineffective for determining the thickness of ultra-thin dielectrics films, i.e. dielectric films having an EOT equal to or less than about 40 Å. When leakage current tunnels through the dielectric layer, the charge $\Delta Q_C$ is reduced by the amount of charge transported across a dielectric layer during the time of charging and measuring $\Delta V$. In thicker dielectric layers, such as $SiO_2$, the leakage current is typically below $10^{-12}$ A/cm$^2$ for a corona charge, $\Delta Q_C$, of about $2\times10^{-7}$ C/cm$^2$. During a typical measuring time for these techniques, e.g., 100 seconds, the leakage of current via tunneling through the thicker dielectric layer reduces $\Delta Q_C$ by about $10^{-10}$ C/cm$^2$. The value $10^{-10}$ C/cm$^2$, however, is practically insignificant relative to $\Delta Q_C$, i.e., $2\times10^{-7}$ C/cm$^2$. For ultra-thin dielectric layers, the leakage currents are orders of magnitude larger than the leakage currents for thicker dielectric layers, e.g., often exceeding $10^{-9}$ A/cm$^2$. As a result, leakage of current over a measuring time of 100 seconds will reduce the value of $\Delta Q_C$ by about $10^{-7}$ C/cm$^2$ and will cause significant errors in calculating the thickness of the dielectric layer. Additionally, in high accuracy measurements on thin dielectric layers, the value of $\Delta V$ is typically corrected to account for a voltage drop, $\Delta V_{SB}$, across the semiconductor surface space charge layer by replacing $\Delta V$ with the expression $\Delta V-\Delta V_{SB}$. Errors in determining the dielectric layer thickness are more severe in this instance because leakage current not only corrupts the value of $\Delta Q_C$ but also the calculation of $\Delta V_{SB}$.

SUMMARY

In general, the invention relates to an apparatus and method for producing electrical measurements of capacitance and thickness of ultra-thin dielectric layers on semiconductor substrates (wafers). The apparatus and method produces effective and accurate measurements of the dielectric layer thickness despite substantial leakage of current across the layer and no apriori knowledge of the relationship between the leakage current characteristics, i.e., measured electrical properties such as voltage and current, and thickness of the dielectric layer. Ultra-thin dielectric layers have an equivalent oxide thickness equal to or less than about 40 Å. As used herein, the term "dielectric" includes but is not limited to oxides, e.g., $SiO_2$, $Ta_2O_5$, $Al_2O_3$, nitrides, e.g. $Si_3N_4$, and barium strontium titianate (BST The non-contact electrical technique can be used to record multiple, repeatable measurements of ultra-thin dielectric capacitance and thickness at the same location on the wafer under highly reproducible conditions.

In one aspect of the invention, the method of determining the thickness of a dielectric layer on a semiconductor wafer includes depositing an electric charge sufficient to cause substantially a steady state condition in which charge current is substantially equal to the leakage current; measuring the potential of the dielectric surface; and comparing the measured parameters to calibrated parameters to derive the dielectric layer thickness. The dielectric layer can be a patterned dielectric layer including thick and thin regions of dielectric material. The dielectric material of the thin region can include a different material than the dielectric material of the thick region and the thin region can include more than one dielectric material.

In another aspect of the invention, the method of determining the thickness of a dielectric layer deposited on a semiconducting wafer includes depositing an ionic charge onto a surface of the dielectric layer deposited on the semiconducting wafer with an ionic current sufficient to substantially cause a steady state condition; measuring a voltage decay on the dielectric surface as a function of time; and determining the thickness of the dielectric layer based upon the measured voltage decay. The method can further include measuring the voltage decay after terminating the deposition of ionic charge.

In another aspect of the invention, the method of determining the thickness of a dielectric layer deposited on a semiconducting wafer includes depositing an ionic charge onto a surface of the dielectric layer with an ionic current sufficient to cause substantially a steady state condition; ceasing deposition of ionic charge after establishing the steady state condition; measuring a voltage decay on the semiconducting wafer as a function of time after ceasing the ionic charging; analyzing the voltage decay to determine a characteristic of the measured voltage decay, the characteristic of the measured voltage decay being selected from the group consisting of an initial surface potential, $V_0$, a surface potential at a time greater than t=0, $V_D$, and an initial rate of voltage decay, $dV/dt|_{t=0}$; and determining the thickness of the dielectric layer based upon the characteristic of the measured voltage decay.

Embodiments of the invention can include one or more the following. Measuring the voltage decay includes using a non-contact probe. The dielectric layer has a thickness of about 40 Å or less. The dielectric layer can be uniform in thickness or patterned. The steady state condition results when the ionic current substantially equals a leakage current flowing from the semiconducting wafer and across the dielectric layer. The step of determining the thickness of the dielectric layer includes determining the initial surface potential, $V_0$, on the dielectric layer from the measured voltage decay. The initial surface potential, $V_0$, is determined by extrapolating the measured voltage decay back to t=0. The step of determining the thickness of the dielectric layer further includes using the initial surface potential, $V_0$, in a linear expression to calculate an equivalent oxide thickness, T, of the dielectric layer, the linear expression given by the relationship $V_0=aT+b$. The coefficients a and b in the linear expression are determined by a calibrating procedure. The calibrating procedure includes recording a decay voltage on semiconducting wafers each having a known dielectric layer thickness, and determining from each measured voltage decay an initial surface potential. The calibrating procedure includes depositing an ionic charge onto semiconducting wafers each having a known dielectric layer thickness to generate an ionic current, $J_C$, recording a decay voltage on the semiconducting wafers, and determining from each measured voltage decay an initial surface potentials. The semiconducting wafers may or may not include a patterned dielectric layer having thick and thin regions of dielectric material. The step of depositing an ionic charge onto a surface of a patterned dielectric layer disposed on the semiconducting wafer with an ionic current sufficient to cause a steady state condition includes depositing a reduced ionic current given by the relationship $J_C/(1+S_{Thick}/S_{Thin})$, where $J_C$ is the ionic current generated in the calibrating procedure on unpatterned wafers and $S_{Thick}/S_{Thin}$ is the ratio of the surface thick region surface area relative to the thin region surface area. The step of depositing the ionic charge on the surface of the patterned dielectric layer to substantially cause a steady state condition includes generating a substantially equipotential surfaced over thick and thin regions of the patterned dielectric layer via electromigration of the ionic charge. The semiconductor wafer is p-type silicon having a doping of about $1\times10^{15}$ cm$^3$, the dielectric layer is $SiO_2$, the corona charge has positive polarity, the thickness of the dielectric layer is about 40 Å or less, a is about 88 mV per Å, and b is about −550 mV. The method further includes resealing the coefficient b by adding the value $\Delta b$, where $\Delta b[mV]=-26 \ln(N_{A2}/N_{A1})$ in which $N_{A1}$ is a dopant concentration in a calibrating semiconducting wafer having a known dielectric layer thickness and $N_{A2}$ is a dopant concentration in the semiconducting wafer being measured. The step of determining the thickness of the dielectric layer includes determining the surface potential at a time greater than t=0 on the dielectric surface from the measured voltage decay. The surface potential is determined at a time of about 1 second after t=0. The step of determining the thickness of the dielectric layer includes using the surface potential at a time greater than t=0, $V_D$, to calculate a dielectric thickness, T, via the expression $V_D=cT+d$, in which the coefficients c and d are derived from a calibrating procedure. The method further includes the step of determining the thickness of the dielectric layer includes using the surface potential at a first time greater than t=0, $V_{D1}$, and at second time greater than t=0 and different than the first time, $V_{D2}$(e.g., greater than the time at which $V_{D1}$ is recorded), to calculate a dielectric thickness, T, via the expression $V_{D1}-V_{D2}=c_1T+d_1$, in which the coefficients $c_1$ and $d_1$, are derived from a calibrating procedure. The calibrating procedure includes measuring a voltage decay on semiconducting wafers each having a known dielectric layer thickness, and determining from each measured voltage decay a surface potential, $V_D$, at the same time in the decay, the time being greater than t=0. The steps of depositing a charge onto a surface of the dielectric layer, measuring the voltage, $V_0$, and determining the thickness of the dielectric layer all occur in about 7 seconds or less. The method further includes determining the capacitance of the dielectric layer deposited on the semiconducting wafer. The capacitance is obtained from the relationship $C_{ox}=J_C/R$, where $J_C$ the ionic current at the steady state condition, R is the initial voltage decay rate, $dV/dt|_{t=0}$, derived from the measured voltage decay. The voltage decay is measured after terminating the deposition of ionic charge. The steps of depositing ionic charge, measuring the voltage decay, and determining the thickness are performed on a measurement area smaller than a total surface area of the semiconducting wafer. The method further includes precharging the dielectric layer by depositing an ionic charge. The method further includes illuminating the dielectric surface to eliminate the semiconductor surface depletion layer and its contribution to $V_0$, $V_D$, and $dV/dt|_{t=0}$. The method further includes performing the steps of depositing ionic charge, measuring voltage decay, and determining the dielectric thickness on a plurality of measurement sites on the dielectric layer. The method further includes cleaning the dielectric layer with a pre-cleaning solution prior to depositing the ionic charge onto the surface of the patterned dielectric layer. The ionic charge can be negative or positive polarity.

In ultra-thin dielectric layers, the leakage current mechanism may differ from the mechanism of leakage in thicker dielectrics layers. For example, Fowler-Nordheim (F-N) tunneling dominates in thick $SiO_2$ layers that exceed 40 Å. In this process, electrons tunnel over a distance of about 40 Å from the silicon to the $SiO_2$ conduction band and then travel across the rest of $SiO_2$ layer. For $SiO_2$ layers thinner than 40 Å, electrons tunnel directly across the entire dielectric layer, producing much larger currents for lower oxide voltages. For non-$SiO_2$ dielectrics, leakage current mechanisms, other than F-N tunneling or direct tunneling, such as Schottky emission or Frenkel-Poole emission can be dominant. (For discussion of conduction processes in insulators, see for example, "Physics of Semiconductor Devices" by S. M. Sze, John Wiley & Sons, 1981; p. 402 to 407). As a result, the exact tunneling current equation relating the layer thickness to electrical parameters such as the tunneling leakage current and the voltage drop across a dielectric layer may not be known apriori. Advantageously the method of this invention, unlike the method discussed in U.S. Ser. No. 09/451,652, can be used to determine the thickness of a dielectric layer without knowing apriori the exact tunneling current equation relating the measured electrical parameters to the dielectric layer thickness. The apparatus and methodology can be used to determine dielectric layer thicknesses with a 0.01 Å sensitivity, a factor of 10 better than standard methods, a repeatability of about 0.03 Å for a 30 Å thick dielectric layer and about 0.04 Å for a 17.6

Å thick dielectric layer, and a tolerance to changes in the corona ionic current of about a factor of 20 greater than standard methods.

The details of one or more embodiments of the invention are set forth in the accompanying drawings and the description below. Other features, objects, and advantages of the invention will be apparent from the description and drawings, and from the claims.

DETAILED DESCRIPTION

The methodology for measuring ultra-thin dielectric layer thicknesses includes depositing an electric charge using a corona current, $J_C$, from a corona discharge source, onto a dielectric layer of a semiconductor wafer to produce a steady state condition in which the leakage current, $J_{LEAK}$, equals $J_C$; terminating the corona current; measuring electrical parameters of the wafer, such as the dielectric potential or the potential decay rate; and comparing the measured electrical parameters to calibrated parameters to derive the ultra-thin dielectric thickness.

Figure 1:
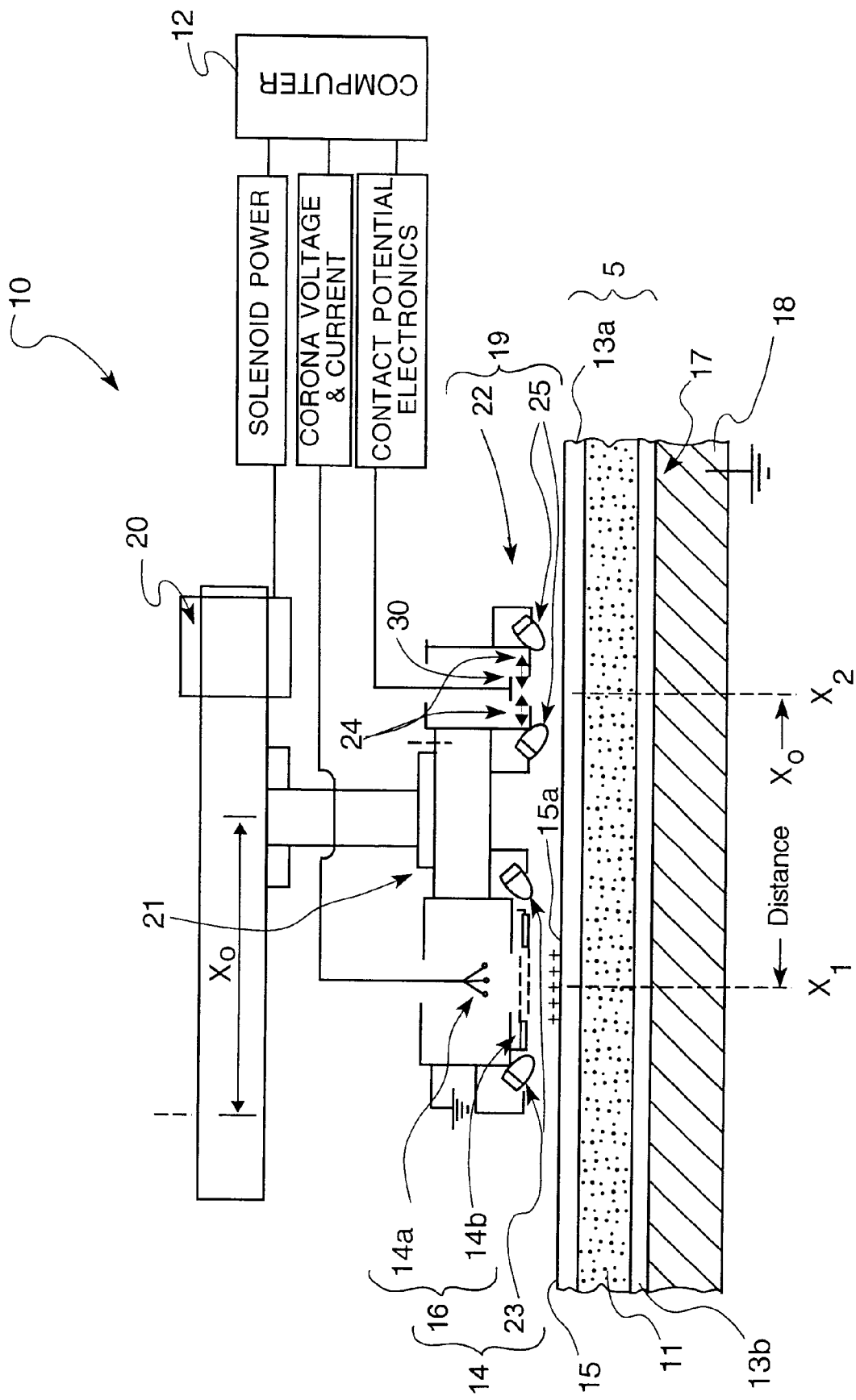
FIG. 1 is a schematic representation of a wafer measurement system for determining dielectric layer thicknesses.

Referring to FIG. 1, a computer controlled test system 10 is used to measure the oxide thickness of a top dielectric layer 13a placed on a semiconductor wafer 5 on a testing site 15a. An example of the computer controlled test system 10 can be found in U.S. Pat. application Ser. No. 09/451,652 by Lagowski et al. which is incorporated herein in its entirety by reference.

Semiconducting wafer 5 includes a semiconductor substrate wafer 11 (e.g., silicon) disposed between overlying and underlying dielectric layers (e.g., $SiO_2$, $Ta_2O_5$, $Al_2O_3$, $Si_3N_4$, and barium strontium titanate (BST)) 13a, 13b. Semiconductor substrate wafer 11 is connected to the ground potential via a back-contact device 17 in electrical contact with grounded wafer chuck 18 or through capacitance coupling of the back surface. Test system 10 measures the oxide thickness by depositing electric charge onto a surface 15 of top dielectric layer 13a, and then monitoring the voltage decay due to current flow through this dielectric layer into or from semiconductor substrate wafer 11.

Test system 10 includes a computer 12 that controls components of the system to apply electric charge to and measure the voltage decay rate, $\Delta V/\Delta t$, at testing site 15a. Based on the measurements, computer 12 also calculates an initial surface potential, $V_0$, i.e., the steady state surface potential that results when the electric charging is first terminated, an initial rate of voltage decay, $R=dV_0/dt|_{t=0}$, the oxide capacitance, and the oxide thickness from voltage data obtained for testing site 15a. The term "initial" denotes values of surface potential and decay rate that are extrapolated back to time zero, t=0, i.e., the moment of ceasing corona charging of the dielectric layer. The test system 10 includes a testing device that contains a charging station 14 and a charge measuring station 19 both of which are translatable, using a solenoid 20, relative to a chuck 18.

Wafer 5 is held, e.g., by vacuum suction, onto chuck 18, which is formed of an electrically conductive material (e.g., aluminum) and is connected to ground potential. A back-contact device 17 protrudes through dielectric layer 13b making electrical contact to semiconductor substrate wafer 11, thereby connecting it to the ground potential. An example of a back-contact device capable of protruding through dielectric layer 13b can be found in U.S. patent application Ser. No. 09/295,919 by Lagowski et al., which is incorporated herein in its entirety by reference. Chuck 18 is mounted on a moveable stage (not shown in FIG. 1) which can position wafer 11 under charging station 14 ($X_1$-position) and charge measuring station 19 ($X_2$-position). Charging station 14 and the charge measuring station 19 are spaced apart from each other on a mount 21 at a fixed distance $X_0$, e.g., about 2 cm, between their centers. Solenoid 20 is used to translate charging station 14 and measuring station 19 by a distance $X_0$ such that the measuring station is precisely above the wafer at the $X_1$-position, i.e., the position previously occupied by the charging station.

Charging station 14 includes a corona discharge source 16 and a light source 23. Corona discharge source 16 includes a corona charging wire 14a which receives a high voltage potential of either a positive or negative polarity as needed and a corona-confining electrode ring 14b, e.g., a metal ring, held at ground potential or a bias so that corona charge is deposited uniformly on a surface 15 of dielectric layer 13a preferably within a radius of about 6 to about 10 mm. Charging station 14 is able to produce a controlled ionic discharge flux (ionic) current suitable for depositing charge with a flux adjustable from about $10^{-6}$ to about $5 \times 10^{-6}$ $A/cm^2$. In general, test system 10 deposits a corona ionic current on the oxide to reach, in less than about 10 seconds, a steady state condition in which the tunneling current, $J_{LEAK}$, flowing across dielectric layer 13a is equal to corona ionic current, $J_C$, without generating traps in the dielectric that result from large corona ion fluxes. Typically, for ultra-thin dielectric layers, a corona ionic current of about 2 $\mu A/cm^2$ will reach a steady state condition in about 3 seconds without creating dielectric traps. The control of the corona ionic current results from adjusting the high voltage corona power supply current, the height of corona electrode above the wafer, and/or the bias voltage applied between the corona charging wire and the ion flux confining electrode.

Test system 10 can deposit either a positive or negative charge on the surface. Typically, test system 10 positively charges the surface with a positive corona discharge because a negative corona discharge is more difficult to control with respect to charging uniformity. Non-uniform surface charging can produce non-uniformity in the initial voltage, $V_0$, which in turn would generate errors in deriving the oxide thickness. As will be described in greater detail below, non-uniformities in surface charging can be overcome by deriving a dielectric layer thickness from electrical parameters measured after a specific delay time relative to the moment of ceasing the corona charging, rather than at a time t=0.

Charge measuring station 19 includes a light source 25 and a contact potential sensor 22, such as a Kelvin probe or a Monroe-type probe, which is used to measure the contact potential of dielectric layer 13a with respect to a reference electrode 30, i.e., the contact potential difference $V_{CPD}$ respectively. Sensors of these types are described, respectively, in G. W. Reedyk an M. M. Perlman: Journal of the Electrochemical Society, Vol. 115, p. 49 (1968); and in R. E. Vosteen; Conference Records, 1974 IEEE-IAS 9th Annual Meeting, p. 799, the entire contents of which are incorporated herein by reference. An example of a commercially available device is the Isoprobe model 162 by Monroe Electronics, Lyndonville, N.Y. 14098. Typically, electrode 30 is separated from the top surface of the dielectric film by an air gap of about fraction of about a millimeter. The oxide surface potential, V, measured with respect to a vibrating reference Kelvin or Monroe electrode is often referred to as contact potential difference. The change of V caused by a dose of corona charge on the wafer's surface is equal to the change in the voltage drop across the dielectric layer ($\Delta V_{ox}$) plus the change in the semiconductor surface barrier ($\Delta V_{SB}$);

$$\Delta V_{CPD} = \Delta V_{OX} + \Delta V_{SB} \quad (1)$$

The dielectric surface potential, V, decays with time, t, after charging, i.e., V=V(t), due to a neutralization of charge by leakage current, J(t), flowing across the dielectric.

Test system 10 includes light sources 23, 25, preferably green or blue light emitting diodes, to illuminate testing site 15a during charging (light source 23) and during measuring (light source 25) thereby reducing the value of $V_{SB}$ by collapsing the surface depletion region in the semiconductor. Illuminating the dielectric surface is especially necessary in the case of positive charging of an oxide, e.g., $SiO_2$, on the most frequently used substrate in IC-fabrication, i.e., p-type silicon. This specific case, i.e., a $SiO_2$ film on p-type Si substrate, is used as an example to illustrate the method. For p-type (n-type) silicon substrates, positive (negative) corona charge creates a very large depletion layer surface barrier, $V_{SB}$, ranging from 10 to 200 volts, which in dark would decay slowly after terminating corona charging. Illuminating test site 15a efficiently generates excess minority carriers (electrons in the p-type Si and holes in n-type Si) in a silicon depletion layer beneath the $Si/SiO_2$ interface rapidly collapsing the depletion layer and removing the contribution to V. Without illumination, the potential drop across the silicon depletion region would dominate the non-contact potential measurements and thereby prevent reliable measurement of the oxide thickness. For silicon, light having a wavelength less than 1 $\mu$m produces electron-hole pairs which can suppress $V_{SB}$. Typically, green or blue diodes are used that emit light at a wavelength of about 500 nm to 350 nm. Shorter wavelengths of light are not desired since they can change trap occupation in the dielectric layer.

In operation, computer 12 sends a signal, for example, to a stepper motor (not shown) to move chuck 18 into position below charging station 14. Computer 12 presets these charging conditions, such as ionic current and charging duration, (i.e., the fluence value determined by a charging current multiplied by the charge time) and sends signals to activate the charging station's light source 23 and to activate the corona discharge source 16. After depositing the charge onto testing site 15a of dielectric surface 15, computer 12 sends signals to turn the discharge source off, to turn on the charge measuring station's light source, to turn off the discharge station's light source, and to move the charge measuring station, via the solenoid, to position the contact potential sensor above the charged surface of the wafer, i.e., above testing site 15a. This set of operations is done fast enough, e.g., typically about 50 milliseconds, to reduce the amount of charge neutralized prior to starting the measurement.

Figure 2:
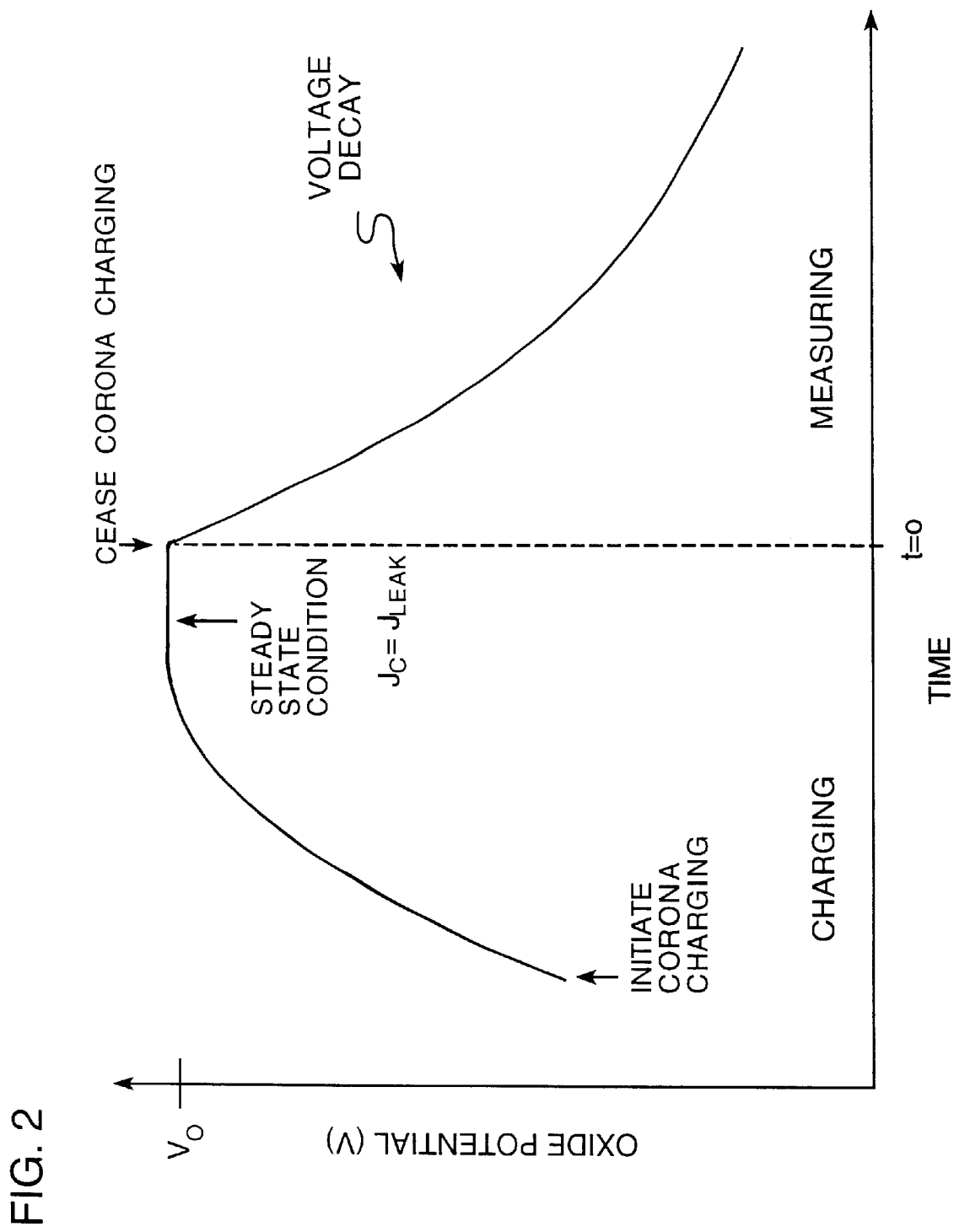
FIG. 2 is a graph of the surface potential decay.

Once measuring station 19 is above charged testing site 15a, the computer acquires the measured data of the surface potential, V, vs. time, t, as shown in FIG. 2. The typical time period of acquiring the data is about 3 seconds. Based on the measured voltage decay, the computer calculates the time derivative of V as dV/dt, determines an initial surface potential, $V_0$, by extrapolating the measured voltage back to the initial time, t=0, at which the corona charging was terminated, and the initial rate of decay, $R=dV/dt|_{t=0}$. The computer can derive these values by fitting the measured voltage decay to a polynomial expression or other appropriate mathematical model. Typically, the computer begins measuring the surface potential decay after terminating corona charging and then monitors and samples the voltage decay at a rate sufficient to facilitate an accurate determination of the initial surface potential value $V_0$, the initial decay rate $R=dV/dt|_{t=0}$, and the oxide thickness. For example, the computer can being monitoring the decay less than about 200 milliseconds after terminating corona charging and continue monitoring the surface potential at a sampling rate of about 10 voltage measurements per seconds or more so that the computer can accurately determine the initial surface potential value $V_0$, the initial decay rate $R=dV/dt|_{t=0}$, and the oxide thickness in about 3 seconds, after terminating the corona charging or in less than the total time of 7 seconds after initiating corona charging of the dielectric surface.

After calculating the initial surface potential, the computer can determine an equivalent oxide thickness, (EOT), by using the relationship:

$$V_0 = aT + b \quad (2)$$

where the coefficients a and b are empirical parameters determined from calibrating measurements obtained from a calibrating procedure. The calibrating procedure includes measuring the surface potential and determining $V_0$ for several different thicknesses of $SiO_2$ layers on silicon (e.g., p-type with known doping concentration). Each of the calibrating measurements are conducted with the same predetermined corona flux that achieves the steady state condition without generating corona stress and dielectric traps. In general, the corona flux is predetermined by depositing a corona flux sufficient to cause the steady state condition but small enough not to generate corona stress and dielectric traps. The latter can be ascertained by monitoring the stress-induced leakage current (SILC). Methods for measuring SILC are described for example in U.S. patent application Ser. No. 09/451,652 by Lagowski et al. A predetermined corona charge between about 1 $\mu A/cm^2$ to 2 $\mu A/cm^2$ produces a steady state condition in dielectric layers having thicknesses of about 40 Å or less without generating SILC or traps in under 5 seconds. For calibration, each thickness of the $SiO_2$ layers must be known (e.g. from high precision optical measurements performed immediately after oxidation to avoid thickness error associated with adsorbed water or organic contaminants). The calibrating corona charging and $V_0$ measurements, typically, are performed on the same surface location used to record the optical thickness measurement.

Figure 3:
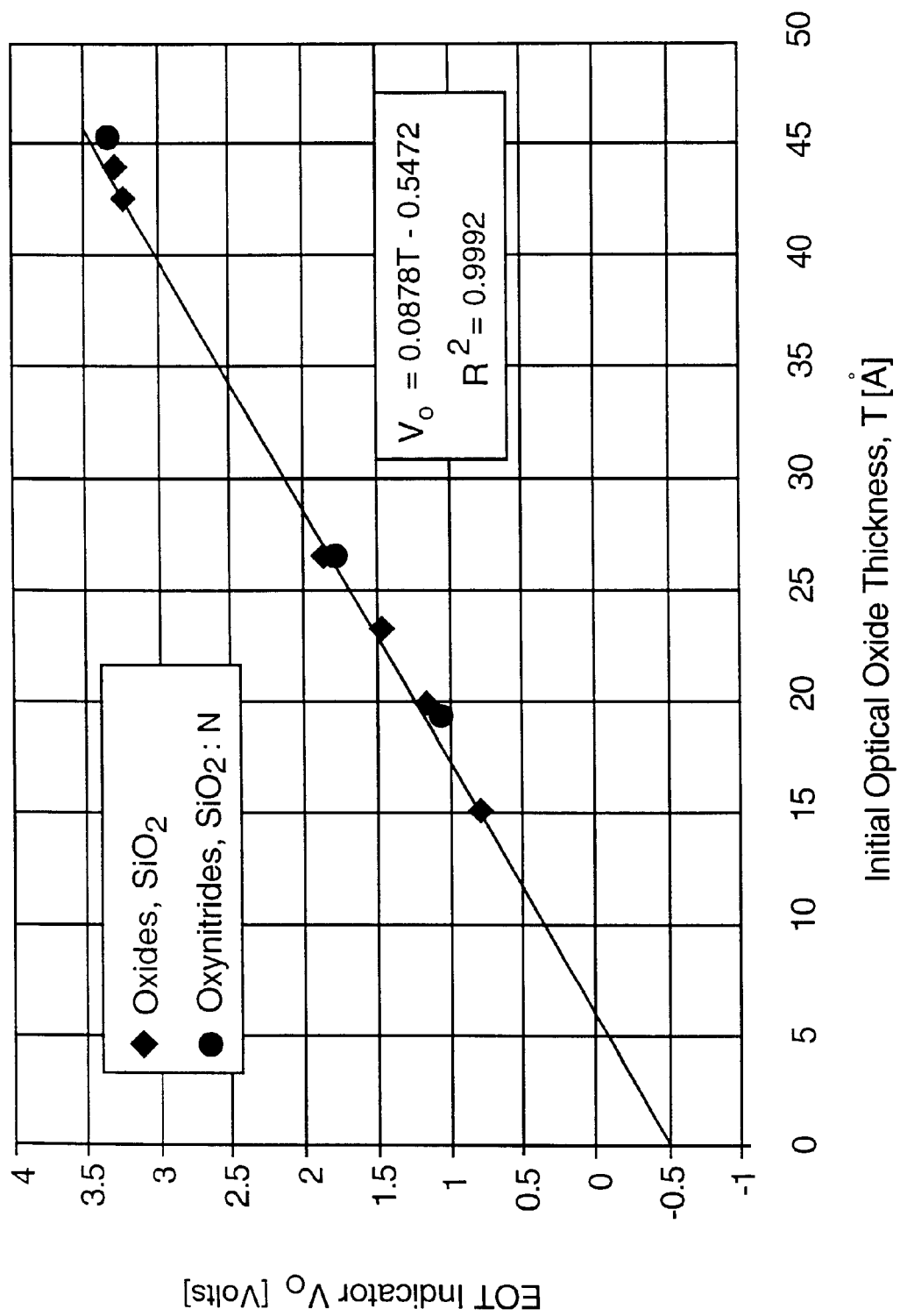
FIG. 3 is a graph of calibrating data for ultra-thin $SiO_2$ dielectric layers recorded with the test system.

Referring to FIG. 3, the coefficients a and b are determined from the plot of $V_O$ vs. T using a linear regression. For positive corona charging of ultra-thin dielectric layers, e.g., less than about 40 Å, $V_O$ increases with oxide thickness with a rate of about 0.0878 volt per angstrom (or 87.8 mV per Å) for p-type silicon. Typically, test system 10 can measure the surface potential with a precision of 1 mV and thereby determine the dielectric thickness with a precision of 0.01 Å. The coefficient b is in this case negative and equals −0.5472 volts (or −547 mV). This value of b is representative if the reference electrode used for the potential measurements is made of platinum. This coefficient can be scaled for different electrodes, e.g., different electrode materials, by considering different electrode work functions. It can also be scaled to account for different wafer doping concentrations between the calibrated wafers and the measured wafers. For instance, b can be rescaled by adding the value Δb [mvolt]=−26 ln($N_{A2}/N_{A1}$) where $N_{A1}$, and $N_{A2}$ are the dopant concentration in the calibration wafer and the measured wafer respectively. The coefficient b also includes a correction for the semiconductor space charge contribution to the surface voltage, $\Delta V_{SB}$. For example, in p-type substrates, $\Delta V_{SB}$ is related to the inversion space charge layer, or the accumulation layer for positive and negative corona charge, respectively. Although illuminating the wafer, as described above, eliminates contributions from the depleted surface space charge layer, illuminating the wafer does not completely eliminate the inversion or accumulation space charge layer. Test system 10 can also be used to derive an EOT for dielectric layers thicker than about 40 Å. Test system 10 follows the same protocol used in determining EOT's for the ultra-thin dielectric layers, except that the computer uses different values of coefficients a and b.

Figure 4:
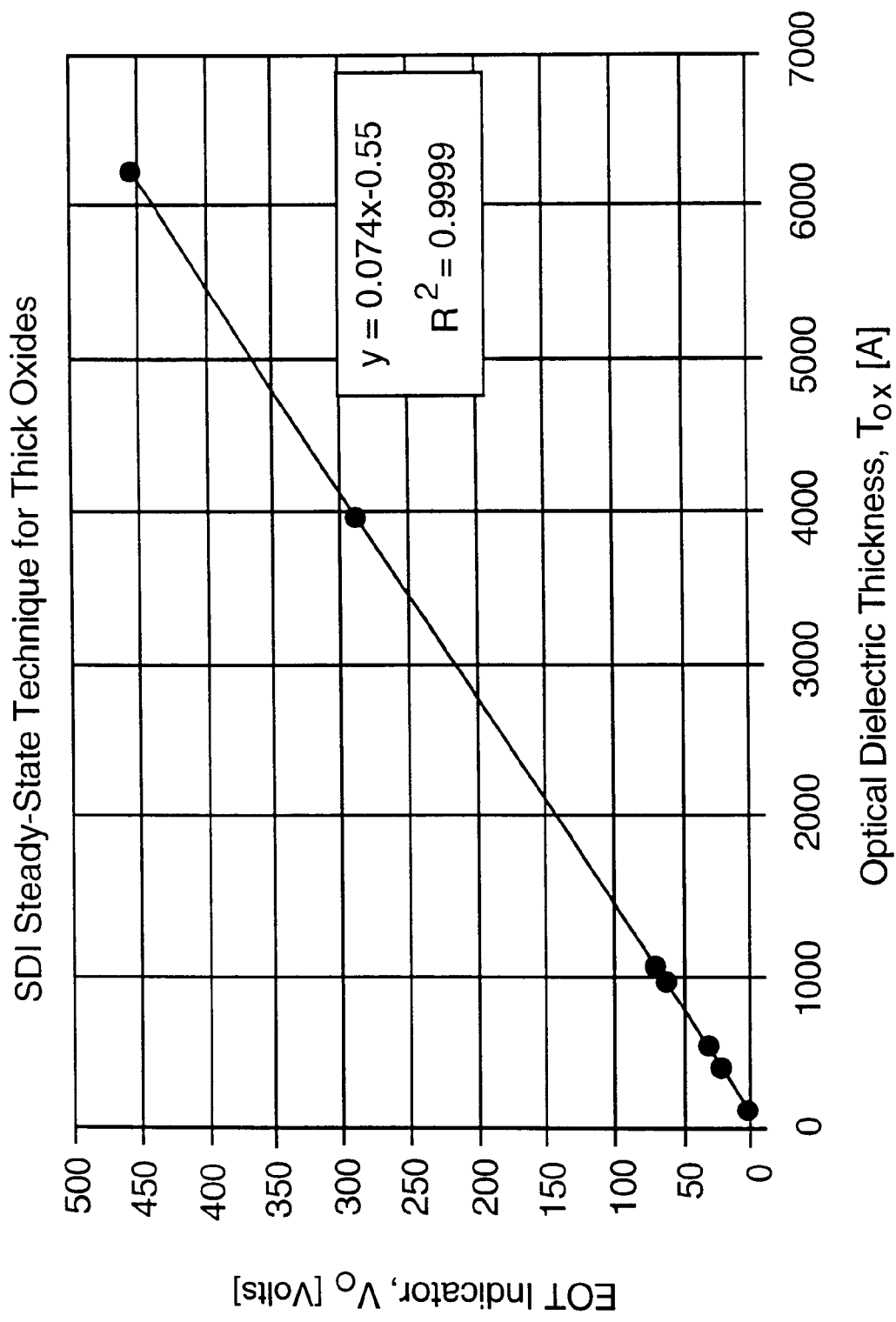
FIG. 4 is graph of calibrating data for $SiO_2$ dielectric layers having thicknesses greater than about 40 Å recorded with the test system.

Referring to FIG. 4, the coefficient a=0.074 volt per angstrom (or about 74 mV per Å), and coefficient b=−0.55, can be determined by from a linear regression of calibrating data, i.e., known oxide thicknesses greater than 40 Å and measured $V_O$ of the known oxide thicknesses.

Figure 5:
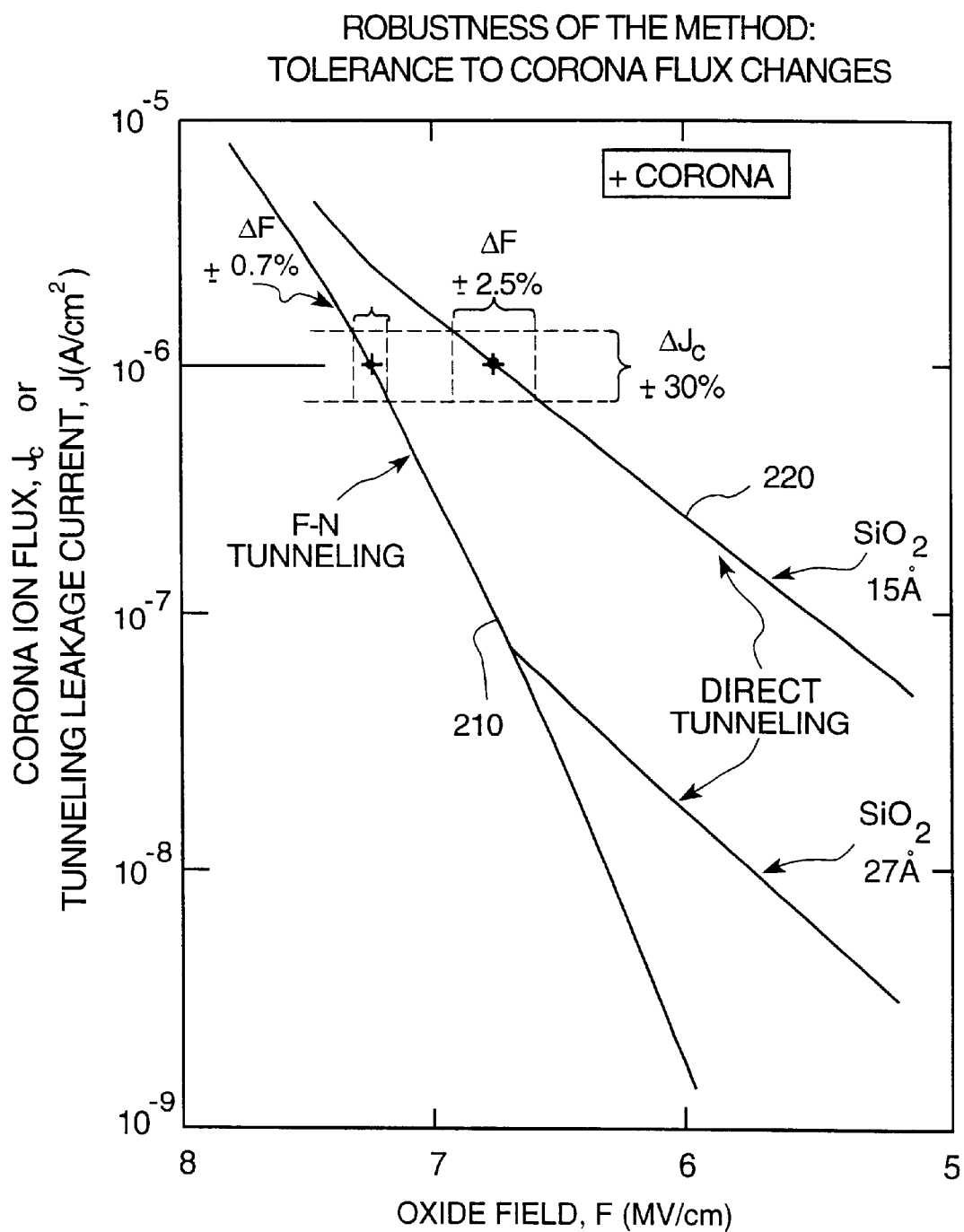
FIG. 5 is a graph of tunneling currents as a function of oxide field.

Referring to FIG. 5, a plot illustrates the "self adjustment" of $V_O$, i.e., the robustness of the above described methodology to deviations in the corona ionic current. The robustness results from the steady state condition and the strong dependence of the tunneling leakage current, $J_{LEAK}$, on the electric field, F. The voltage drop across a dielectric layer is related to the electric field by V=T·F, where T is the thickness of the dielectric layer. Under a steady state condition $J_{LEAK}$ equals the corona ionic current, $J_C$, such that for every value of $J_C$ that produces a steady state condition, the initial surface potential, $V_O$, assumes a value equal to T·F in which F is dictated by the tunneling current characteristics shown in the plot. Different values of $J_C$ result in different values of $V_O$. For instance, tunneling current characteristics 210 and 220 correspond to a semiconducting wafer including a $SiO_2$ layer having a thickness of 27 Å and 15 Å respectively. Focusing on characteristic 210, a typical corona ionic current of about 1 $\mu A/cm^2$ corresponds to a field, F, of about 7.25 MV/cm. A change in the corona ionic current of about ±30%, which still produces a steady state condition, results in a change of field, F, of about ±0.05 Mv/cm and a relative change in $V_O$ of only about ±0.7%. Similarly, characteristic 220 reveals that a change in the corona ionic current of about ±30%, at a corona ionic current of about 1 $\mu A/cm^2$, only results in a change of $V_O$ of only about ±2.5%. Changes in $V_O$ due to changes in corona ionic current are significantly smaller than the deviation of current. The steady state condition facilitates dielectric thickness measurements that are robust and tolerant of significant changes in corona ionic current either between different test systems or repeat measurements of wafers on the same test system due to changes in ambient conditions such as humidity and temperature. The steady state condition also facilitates self-adjustments of the oxide surface charge, $Q_C$, and the surface barrier, $V_{SB}$. As a result, the steady state condition methodology facilitates excellent quantative matching of thickness measurements performed on different semiconductor monitoring tools, e.g., the testing systems described above.

Figure 6:
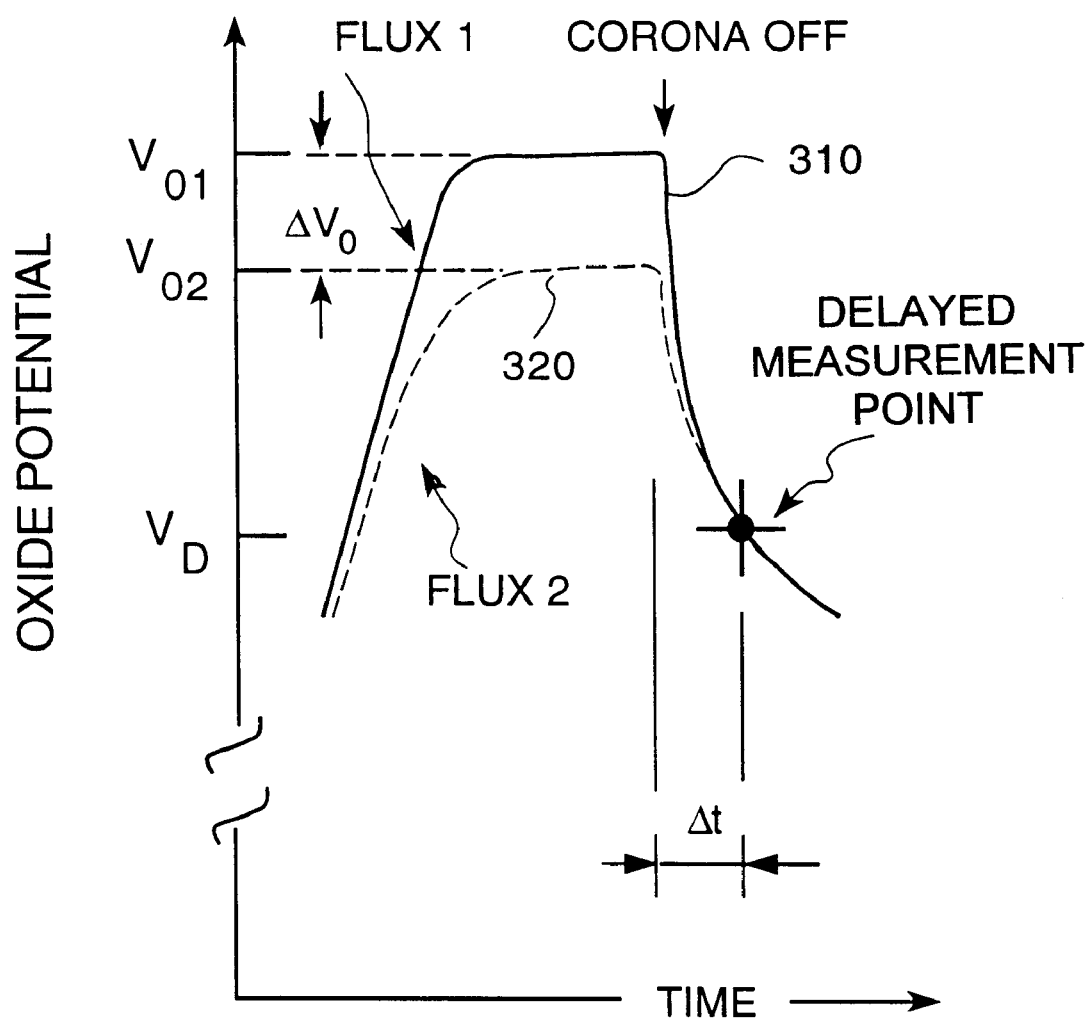
FIG. 6 is a graph schematically representing the effects of self-adjusting surface potentials.
Figure 7:
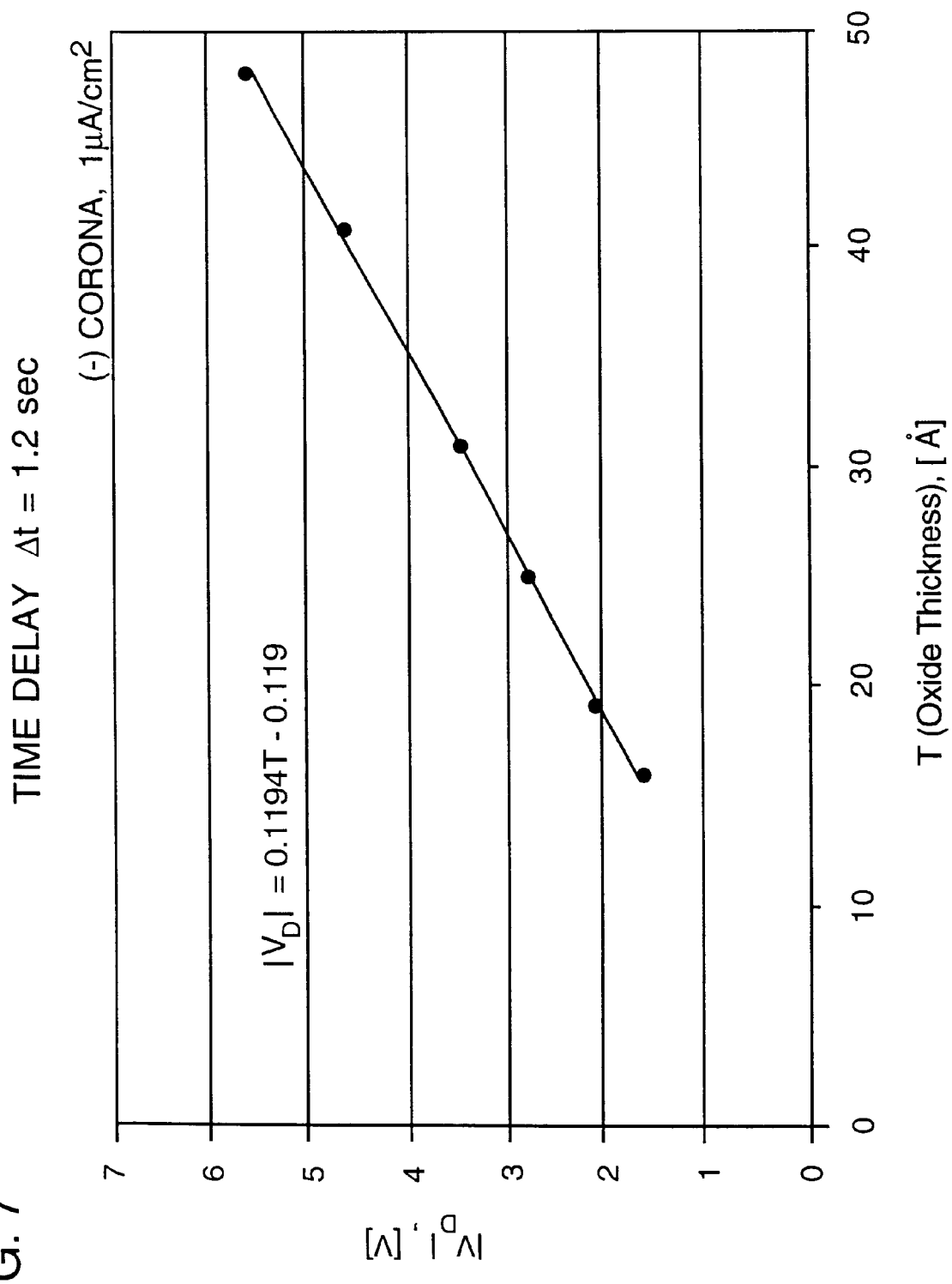
FIG. 7 is a graph of calibrating data for $SiO_2$ layers utilizing time delay methodology and negative corona charging.

In certain embodiments for achieving extremely accurate measurements, the test system 10 employs a method of measuring the surface potential at a delayed time after terminating corona charging. This method further reduces errors in determining the dielectric layer thickness due to deviations of the initial surface potential, $V_O$, caused by different corona ionic currents. Referring to FIG. 6, a surface potential curve 310 results from applying corona flux 1 and a surface potential curve 320 results from applying corona flux 2 to the dielectric. The difference between corona flux 1 and 2 results in different initial surface potential values. As described above with respect to FIG. 5, at 1 $\mu A/cm^2$, a deviation of 30% in the corona ionic current causes a deviation, $\Delta V_O$, of about ±2.5% in a 15 Å thick dielectric layer and about ±0.7% in a 27 Å thick dielectric layer of $SiO_2$. The errors in $V_O$ cause equivalent errors in the calculated dielectric layer thickness, T (see equation 2). Test system 10 reduces the errors in T by determining the surface potential from the voltage decay at a time, αt, after t=0, i.e., the surface potential, $V_D$, at the delayed time. After the steady state condition is reached, the potential decay obeys a logarithmic time dependence given by $$1/V(t) = a + b \ln(t+t_0) \quad (3)$$

where $t_0$ depends on the value of the corona ionic current. As the corona charging increases the value of $t_0$ decreases and vice versa. For a 27 Å thick dielectric layer of $SiO_2$, to is about 0.05 seconds when the corona ionic current is about 1 $\mu A/cm^2$, but increases to about 0.5 seconds when the corona ionic current decreases by a factor often to 0.1 $\mu A/cm^2$. After $t_0$, the surface potential decay curves resulting from different corona ionic currents merge such that differences between the delayed measured surface potentials, $\Delta V_D$, have decreased relative to the differences between the initial measured surface potentials, $\Delta V_O$. In general, the surface potential, $V_D$, is determined using a delay time t larger than to. For example, $V_D$ can be determined at a time delay of about 1.2 seconds for a corona current of 2 $\mu A/cm^2$. If necessary, the relationship $$\Delta V_D \alpha \Delta V_O (t_0/(t+t_0)) \quad (4)$$

can be used to determine the length of a time delay needed to reduce errors in $V_O$ by a specific amount. For instance, when $t_0$ is 0.05 seconds, a delay time, t, of 1 second will reduce errors caused by deviations in corona ionic current by about a factor of 20, i.e., $\Delta V_D \alpha 0.05 \Delta V_O$. Test systems that determine the surface potential after a time delay are particularly useful in negating instabilities of the corona ionic current magnitude, typically found in negative corona discharges. As shown in FIG. 7, for negative corona charging, $V_D$ scales linearly with T via the relationship given by equation 2. Coefficients a and b are determined by fitting calibrating data, $V_D$ and known T, to a linear regression. Of course, these coefficients are different than those determined for calibrating data from positive corona charging. $V_D$ calibrating data are recorded for each known thickness at the same corona ionic current and time delay. $V_D$ also scales linearly with a positive corona charging. Advantageously, when using negative corona charging, as opposed to positive corona charging, the coefficient "a" is large, i.e., larger for negative charging than for positive charging. Large values for "a" provide a larger sensitivity in measuring the dielectric thickness.

Figure 8:
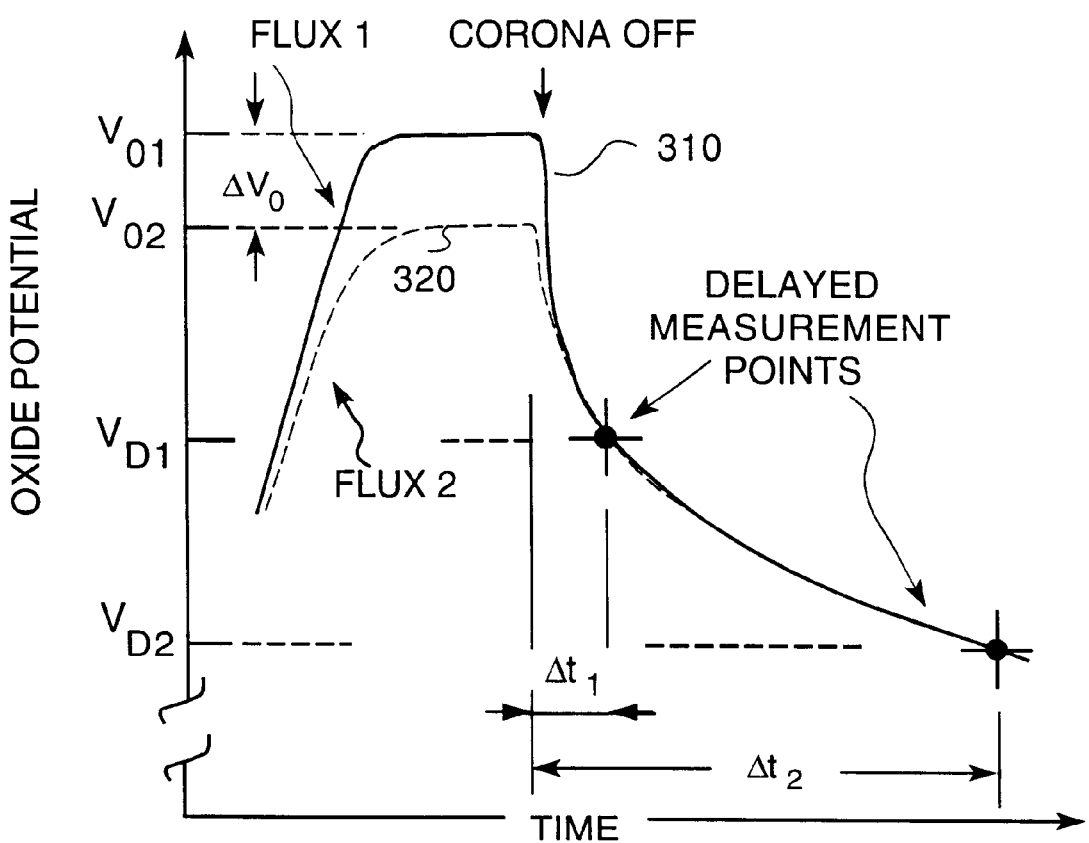
FIG. 8 is a graph schematically representing a time delay methodology based on two delayed measurements.

Referring to FIG. 8, a method using two delayed time measurements of the surface potential is illustrated. In this approach $V_{D1}$ is measured after time interval $\Delta t_1$ and $V_{D2}$ is measured after time interval $\Delta t_2$, in which both times are delayed relative to terminating corona charging. The thickness of a dielectric layer, T, can be determined from the expression $$V_{D1} - V_{D2} = c_1 T + d_1 \quad (5)$$

where $c_1$ and $d_1$ are the parameters determined from calibrating measurements. The calibrating measurements are recorded as discussed above with respect to single measurements of the surface voltage, i.e., same corona charging, except that the voltage decay is sampled at the same two time delays for several semiconductor wafers having known dielectric thicknesses. The doping correction to the surface voltage is constant over the voltage decay. As a result, measuring the relative voltage change at two specific delay times within the decay and taking their difference eliminates the need to correct the parameter $d_1$ to account for differences in doping levels between the semiconductor wafers used in the calibrating measurements and those being tested. The dual decay measurements also provides a parameter $d_1$ that is insensitive to changes in the work function of the reference electrodes used in potential measurements.

In alternative embodiments, test system 10 can determine dielectric layer thicknesses from capacitance measurements by using the initial rate of the voltage decay, $R = dV_0/dt$, after ceasing the corona charging. Assuming test system 10 reaches the steady state condition, at the moment of ceasing corona charging $J_{LEAK} = J_C$ and $J_{LEAK}$ equals $$\frac{dQ_c}{dt} = C_{ox}\left(\frac{dV}{dt} - \frac{dV_{SB}}{dt}\right). \quad (6)$$

$C_{ox}$ is the capacitance and is equal to $\epsilon_0 \epsilon_{ox}/T$ where $\epsilon_0$ is the permittivity of free space and $\epsilon_{ox}$ is the dielectric constant of dielectric layer. The value of $C_{ox}$ is determined from initial value of the voltage decay rate, $R = dV/dt|_{t=0}$, according to the expression $$C_{OX} = J_C/(R - R_{SBO}). \quad (7)$$

where $J_C$ is the known corona flux, $R = dV_{SB}/dt$ is measured, and $R_{SBO}$ is the rate of the surface barrier decay that constitutes a small correction to R of about 5% or less. For high precision measurements $R_{SBO}$ can be calculated from surface electrostatic equations that take into account Quantum corrections and Fermi-Dirac Statistics. Such calculations can be done using treatment developed for MOS capacitors in strong inversion or accumulation as described by C.Raynaud et.al in Mat. Res. Soc. Symp. Proc. Vol 592, p. 159 (2000). In some embodiments, such as in performing preliminary or low level manufacturing controls, $R_{SBO}$ can be neglected such that $C_{ox} = J_C/R$. In general, neglecting $R_{SBO}$ may be justified when the electric field is high in both the dielectric layer and in the semiconductor. In low electric field measurements of T, the contribution from the surface barrier changes, $dV_{SB}$, usually cannot be neglected since doing so can cause $C_{ox}$ to be underdetermined by about 30% to 50% for $SiO_2$ dielectrics having thicknesses at or below about 40 Å.

Figure 9:
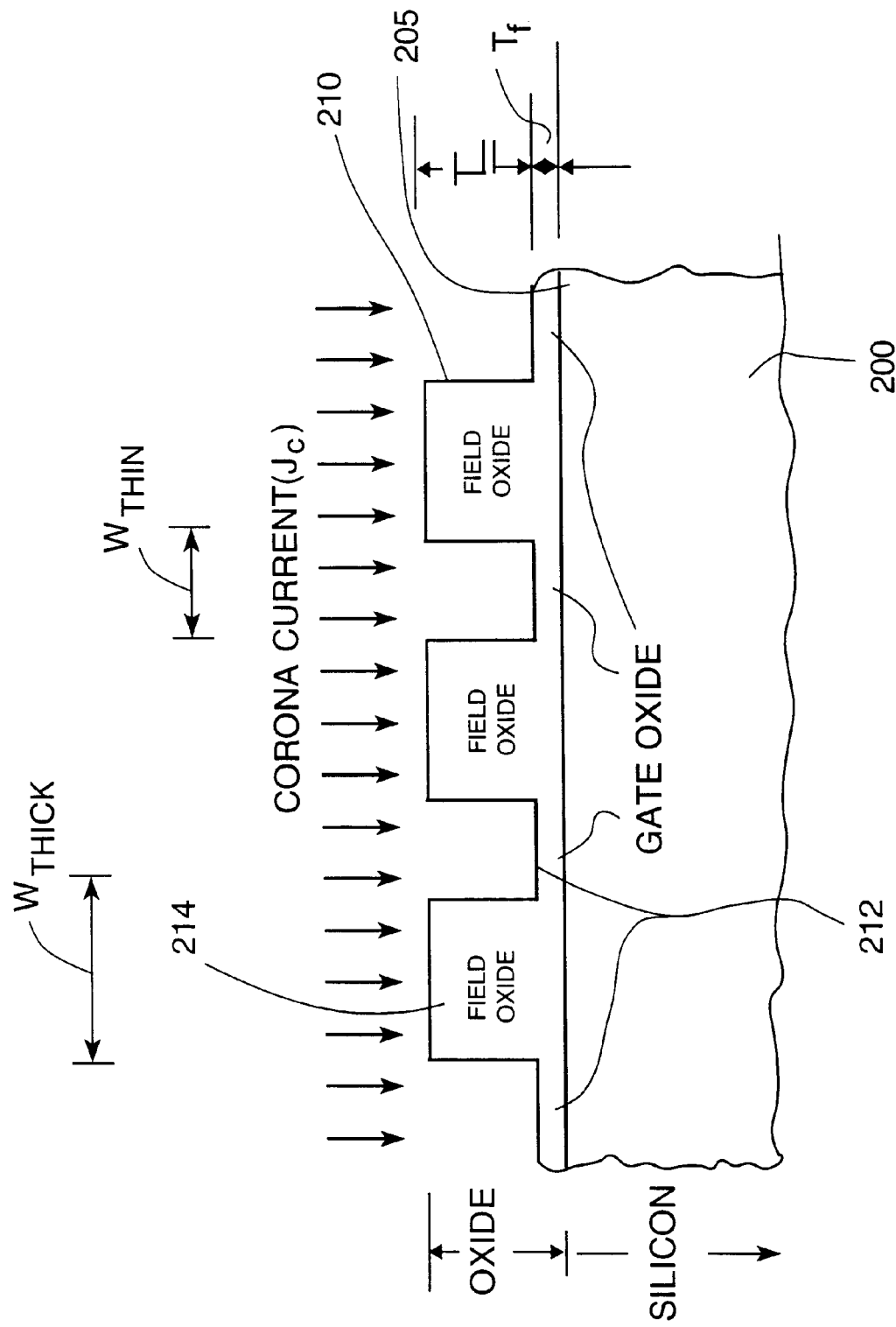
FIG. 9 is a schematic representation of a patterned wafer including regions of thick and thin dielectric material.

In other embodiments, test system 10 can be used to determine the thickness of thin dielectric layers on a semiconductor substrate wafer including thick and thin regions of dielectric material. Referring to FIG. 9, a patterned dielectric layer 210 disposed on a surface 205 of a semiconductor substrate wafer 200, e.g., silicon, includes a plurality of thin regions 212 (e.g., gate oxide regions) and thick regions 214 (e.g., field oxide regions or shallow trench isolation regions). In general, thin regions 212 have a dielectric thickness, $T_G$, less than the dielectric thickness, $T_F$, of thick regions 214. For example, thin regions 212 have a thickness equal to or less than about 40 Å and thick regions 214 have a thickness greater than about 40 Å. Typically, thick regions 214 can have a thickness, $T_F$, at least 25 times greater than the thickness, $T_G$, of thin regions 212. The width of thin region 212, $W_{Thin}$, and thick region 214, $W_{Thick}$, can be the same or different. In general, the width can be any manufacturable dimension. Typically, the width of can be equal to or greater than about 0.1 μm. The thick and thin regions can be formed in any pattern. Examples of patterned dielectric layers include, but are not limited to alternating stripes of thick and thin regions or as grids of thin regions surrounded by thick regions. When formed in a grid, the area of the thin region can be extremely small such as in the range of 0.1 μm² to a few μm².

Patterned dielectric layers can be present on semiconductor substrate wafers at various stages of manufacturing integrated circuits. Test system 10 can be used to monitor the manufacturing process by measuring the thickness of thin regions 212. During operation, test system 10 charges patterned dielectric layer 210 via corona charging with an uniform flux $J_C$. Depending on the dimensions of the patterned dielectric layer one to many thousands of thick oxide regions and thin oxide regions can be simultaneously charged by corona ions. Of course, the system operator can position the wafer such that only a thin region is measured when the patterned dimensions are equal to or greater than the dimensions of site measured by the test system, e.g., about 1 mm² to about 100 mm². Typically, the patterned dimensions are on the order of a few μm so that hundreds to thousands of thick and thin regions are simultaneously measured. Surface potential measurements of the charged area include contributions of the surface potential values from a plurality of thick and thin oxide regions. As a result of corona charging, the surface charge, ΔQ, increases in thin and thick regions via the expression $$\Delta Q = J_C \cdot \Delta t_c$$

where $\Delta t_c$ is the time of charging. The increase of charge also increases the surface potential of the dielectric surface in an amount proportional to the thickness of the dielectric layer. As a result, the thick region, field oxide, surface potential increases by $$\Delta V_F = \frac{\Delta Q}{\epsilon \epsilon_0} \cdot T_F$$

and the thin region, gate oxide, surface potential increases by a smaller amount $$\Delta V_G = \frac{\Delta Q}{\varepsilon \varepsilon_0} T_G$$

since $T_G$ is less than $T_F$. A surface potential difference between the thin and thick regions is given by the relationship $$\Delta V_S = \frac{\Delta Q}{\varepsilon \varepsilon_0} (T_F - T_G)$$

Figure 10:
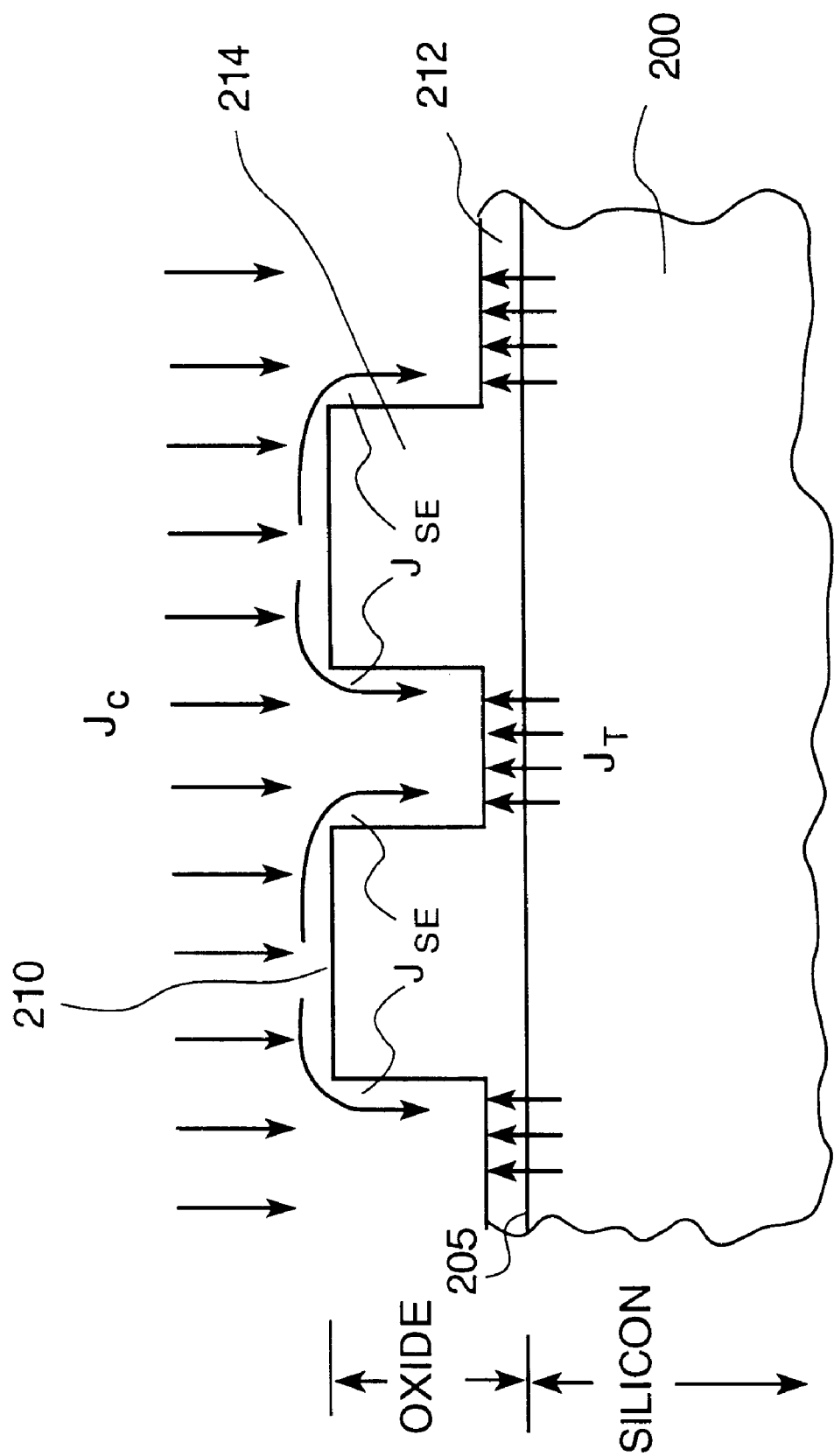
FIG. 10 is a schematic representation of stead-state current flow on patterned wafer under corona charging.

Referring to FIG. 10, since the potential difference, $\Delta V_s$, occurs over a very small surface distance, i.e., on the order of the width of the thick region, corona ions move along the surface from thick regions to thin regions of the dielectric layer to create a surface electro-migration of corona ions. The surface electro-migration current is $J_{SE}$ and flows from thick to thin regions thereby decreasing surface potential of the thick regions until $\Delta V_s \approx 0$, i.e., until $V_F \approx V_G$. As $J_{SE}$ flows, it increases the total current in the thin regions of the dielectric by adding to the corona flux, $J_C$, originally deposited by the test system. When a steady state condition is reached, a tunneling leakage current $J_T$ injected from the semiconductor substrate wafer balances the total current in thin region, e.g., $J_C+J_{SE}$. Under the steady state condition $J_{SE}=(S_{Thick}/S_{Thin}) J_C$ where $S_{Thick}/S_{Thin}$ is the surface area ratio between the thick regions and the thin region of the patterned dielectric layer being measured by test system 10. The thick surface area is determined by calculating the total surface area of the thick region, e.g., the area of the side surfaces plus the top surface, and the thin surface area is determined by calculating the area of the thin region top surface. Thus, if $S_{Thick}/S_{Thin}=2$, the total current in the thin regions is 3 times larger, i.e., $J_C+J_{SE}=3J_C$, than it would have been if the dielectric layer had a uniform rather than patterned thickness.

Figure 11:
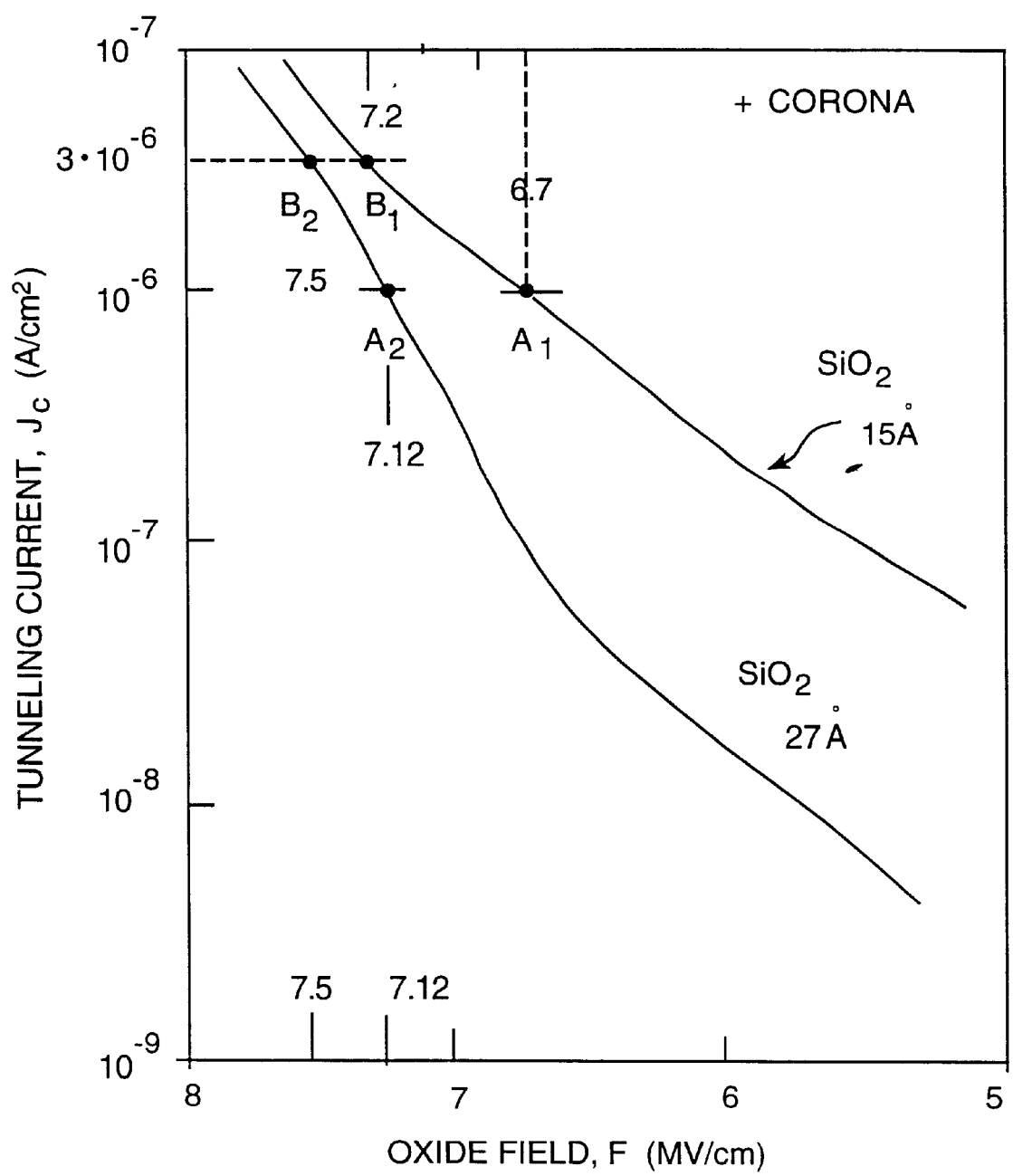
FIG. 11 is a graph schematically representing the effect of increased tunneling current on the oxide field.

Referring to FIG. 11, under the steady state condition, a larger ionic current requires a larger tunneling current which, in turn, increases the oxide field. The corresponding increase in the oxide field, F, produces larger steady state oxide surface potential according to the relationship $$V_0 = F \cdot T$$

An increase in the oxide field created by the ratio $S_{Thick}/S_{Thin} > 1$ causes the steady state condition to move from point A to B along the plot of $J_C$ versus F. For example, assuming a corona current density of $10^{-6}$ A/cm$^2$ and a ratio of $S_{Thick}/S_{Thin}$ approximately equal to 2, the increase in current in the thin region causes the steady state condition to move from $A_1$, 6.7 MV/cm, to $B_1$, 7.2 MV/cm, and $A_2$, 7.1 MV/cm, to $B_2$, 7.5 MV/cm for the thin regions having dielectric thickness of 15 Å and 27 Å respectively. In order, to determine the thickness of the thin regions with the calibrating coefficients derived from a wafer having a uniform thick dielectric layer described above, the increase in the oxide field of the thin region due to surface electro-migration current must be offset by depositing a reduced ionic charge, $J_{CReduced}$, that when added to the surface electro-migration current, $J_{SE}$, will equal the ionic charge at which the calibrating data was recorded, $J_C$. For instance, prior to measuring thin regions on the patterned dielectric layer, the operator can calculate the ratio $S_{Thick}/S_{Thin}$ using wafer manufacturer specifications and enter this value into the central processing unit (CPU) of test system 10. Based on the ratio of $S_{Thick}/S_{Thin}$, the CPU can reduce the corona current density, $J_{CReduced}$, so that the total current in the thin region, $J_{CReduced}+J_{SE}$, will be the same as the current, $J_C$, used to measure calibrating data on semiconductor substrate wafers having a uniform dielectric layer thicknesses. For a patterned wafer with known $S_{Thick}/S_{Thin}$, CPU reduces the corona current according to the relationship $J_{CReduced}=J_C/(1+S_{Thick}/S_{Thin})$, where $J_C$ is the current used in recording the calibrating data on an unpatterned wafer. For example, if $S_{Thick}/S_{Thin}=2$, then test system uses a reduced corona current $J_{CReduced}=3.33\times10^{-7}$ A/cm$^2$ instead of the nominal current $J_C=1\times10^{-6}$ A/cm$^2$ used in recording the calibrating data.

Test system 10 performs the thickness measurements on the patterned dielectric layer using the reduced corona current, $J_{CReduced}$, and by calculating the thin region thickness from the calibrating coefficients determined, as described above, by depositing $J_C$ on a plurality of semiconductor substrate wafers each having a known but different dielectric layer thickness. If the pattern dimensions are not known apriori but are constant on each wafer, test system 10 can monitor the thickness of the thin regions by rescaling the calibrating coefficients obtained from wafers having uniform thick dielectric layers. Test system 10 can derive a coefficient scaling factor by taking the ratio of a surface potential measurement obtained from a patterned calibrating wafer including the unknown pattern, but known thin region thickness, relative to a surface potential measurement obtained from a non-patterned calibrating wafer including a uniform dielectric layer having a thickness equal to the thickness of the thin regions on the pattern calibrating wafer.

Alternatively, the system operator can perform a series of calibrating measurements on patterned wafers if neither the specific pattern dimensions nor the thickness of the thin region on a patterned calibrating wafer are known apriori. The calibrating procedure for patterned wafers is similar to the procedure described above with respect to wafers having uniformly thick dielectric layers. Test system 10 deposits a specific corona charge on the dielectric surface to cause the steady state condition and measures the resulting surface potential on a plurality of patterned wafers each having the same pattern dimensions and known but different thin region dielectric thicknesses. The test system uses the calibrating data to generate calibrating coefficients that can be used to convert surface potential measurements created by the same corona charge and recorded on wafers having the same patterns into thin region thicknesses.

In some embodiments, the surface of the patterned dielectric layer can be pre-cleaned with standard cleaning solutions, such as SC-1 (ammonia, peroxide and H$_2$O) or SC-2 (HCl, peroxide, and water), to enhance the surface electro-migration. The patterned dielectric layer also can be formed from two or more dielectric materials. For example, the thin regions can be formed of one material and the thick regions can be formed of a different material. Alternatively, the thin region can be formed of two or more different materials, such as stacked on top of each other, and the thick region can be formed of a similar or different material. Dielectric patterns containing more than one dielectric material can be formed by any known method such as selective chemical deposition or oxidation. Despite the presence of different dielectric materials, the test system measures the thickness of the thin regions of the patterned dielectric layers via the steady state method. Calibrating procedures for dielectric layers including different material can be performed on semiconductor substrate wafers including dielectric materials and patterns similar to those being monitored.

In some instances of high humidity or high surface ionic contamination, a dissipation of charge deposited on a dielectric from the periphery of the measurement area, may be enhanced by the surface leakage. The magnitude of this process can be reduced by reducing the magnitude of the lateral surface charge gradient between the measurement site and the area surrounding the measurement site. Reducing the lateral surface charge gradient can be accomplished by predepositing corona charge of the same polarity as the one used in the thickness measurements, described above, and on an area larger than the measurement site. Corona charge can be predeposited over an area including or surrounding the measurement site. For example, corona precharging can be deposited over the whole dielectric surface with a uniform blanket of corona charge. A suitable device for a whole wafer corona charging is described in U.S. Pat. No. 6,037,797 by Lagowski et al. A device of this type can be readily incorporated into the apparatus for measuring the dielectric thickness. The amount of corona precharging depends on the amount of corona charging necessary to produce a steady state condition in the measurement site, i.e., measurement charging. If the measurement charging is large, a small precharge may not reduce the lateral surface charge gradient. In general, the amount of corona precharging is of sufficient magnitude relative to the measurement charging necessary for establishing the steady state condition so that corona charge in the measurement site does not dissipate, laterally, into surrounding areas when the testing system is measuring the voltage decay. Several combinations of corona precharging and measurement charging can be employed. For example, the precharging and measurement charging can be equal or one charging can be greater than the other. A number of embodiments of the invention have been described. Nevertheless, it will be understood that various modifications may be made without departing from the spirit and scope of the invention. Accordingly, other embodiments are within the scope of the following claims.

What is claimed is:

1. A method of determining the thickness of a dielectric layer deposited on a semiconducting wafer, the method comprising:
    depositing an ionic charge onto a surface of the dielectric layer disposed on the semiconducting wafer, with an ionic current sufficient to cause a steady state condition;
    measuring a voltage decay on the dielectric surface as a function of time; and
    determining the thickness of the dielectric layer based upon the measured voltage decay.

2. The method of claim 1, wherein measuring the voltage decay includes using a non-contact probe.

3. The method of claim 1 further including terminating the deposition of ionic charge after causing the steady state condition, wherein the voltage decay is measured after terminating the deposition of ionic charge.

4. The method of claim 1, wherein the dielectric layer has a thickness of about 40 Å or less.

5. The method of claim 1, wherein the steady state condition results when the ionic current substantially equals a leakage current flowing from the semiconducting wafer and across the dielectric layer.

6. The method of claim 1, wherein the step of determining the thickness of the dielectric layer includes determining an initial steady state surface potential, $V_0$, on the dielectric layer from the measured voltage decay.

7. The method of claim 6, further including terminating the deposition of ionic charge after causing the steady state condition, wherein the initial surface potential is determined by extrapolating the measured voltage decay back to a time at which the deposition of ionic charge is terminated, i.e. the time t=0.

8. The method of claim 6, wherein the step of determining the thickness of the dielectric layer further includes using the steady state initial surface potential, $V_0$, in a linear expression to calculate an equivalent oxide thickness, T, of the dielectric layer, the linear expression given by the relationship $V_0=aT+b$.

9. The method of claim 8, wherein the coefficients a and b in the linear expression are determined by a calibrating procedure.

10. The method of claim 9, wherein the calibrating procedure comprises recording a decay voltage on a plurality of semiconducting wafers each having a known dielectric layer thickness, and determining from each measured voltage decay an initial surface potentials.

11. The method of claim 8, wherein the semiconductor wafer is p-type silicon having a doping of about $1\times10^{15}$ cm$^3$, the dielectric layer is $SiO_2$, the corona charge has positive polarity, a potential measuring reference electrode is made of platinum, the thickness of the dielectric layer is about 40 Å or less, a is about 88 mV per Å, and b is about −550 mV.

12. The method of claim 11, wherein further including rescaling the coefficient b by adding the value Δb, where $\Delta b[mV]=-26 \ln(N_{A2}/N_{A1})$ in which $N_{A1}$ is a dopant concentration in a calibrating semiconducting wafer having a known dielectric layer thickness and $N_{A2}$ is a dopant concentration in the semiconducting wafer being measured.

13. The method of claim 1, wherein the step of determining the thickness of the dielectric layer includes determining the surface potential on the dielectric surface at a time greater than t=0 from the measured voltage decay.

14. The method of claim 13, wherein the surface potential is determined at a time of about 1 second after t=0.

15. The method of claim 13, wherein the step of determining the thickness of the dielectric layer includes using the surface potential at a time greater than t=0, $V_D$, to calculate a dielectric thickness, T, via the expression $V_D=cT+d$, in which the coefficients c and d are derived from a calibrating procedure.

16. The method of claim 15, wherein the calibrating procedure includes measuring a voltage decay on a plurality of semiconducting wafers each having a known dielectric layer thickness, and determining from each measured voltage decay the surface potential, $V_D$, at the same time in the decay, the time being greater than t=0.

17. The method of claim 1, wherein the steps of depositing a charge onto a surface of the dielectric layer, measuring the voltage, $V_0$, and determining the thickness of the dielectric layer all occur in less than about 7 seconds.

18. The method of claim 15, wherein the steps of depositing a charge onto a surface of the dielectric layer, measuring the voltage, $V_D$, and determining the thickness of the dielectric layer all occur in less than about 7 seconds.

19. The method of claim 13, wherein the step of determining the thickness of the dielectric layer includes using the surface potential at a first time greater than t=0, $V_{D1}$, and a second time greater than t=0 and different than the first time, $V_{D2}$, to calculate a dielectric thickness, T.

20. The method of claim 19, wherein T is determined via the expression $V_{D1}-V_{D2}=cT+d$, in which the coefficients c and d are derived from a calibrating procedure.

21. The method of claim 1, further including determining the capacitance of the dielectric layer deposited on the semiconducting wafer.

22. The method of claim 21, wherein the capacitance is obtained from the relationship $C_{OX}=J_C/R$, where $J_C$ the ionic current at the steady state condition, R is the initial voltage decay rate, $dV/dt|_{t=0}$, derived from the measured voltage decay.

23. The method of claim 1, wherein depositing ionic charge, measuring the voltage decay, and determining the thickness are performed on the measurement area smaller than a total surface area of the semiconducting wafer.

24. The method of claim 1, further including depositing a precharging ionic charge on the dielectric layer on a precharge area larger than an area for which the dielectric thickness is determined.

25. The method of claim 24, wherein the precharging ionic charge is of the same polarity as the charge deposited to achieve the steady state.

26. The method of claim 1 further including illuminating the dielectric surface.

27. The method of claim 1 further including performing the steps of depositing ionic charge, measuring voltage decay, and determining the dielectric thickness on a plurality of measurement sites on the dielectric layer.

28. The method of claim 1, wherein the ionic charge has a positive polarity.

29. The method of claim 1, wherein the ionic charge has a negative polarity.

30. A method of determining the thickness of a patterned dielectric layer deposited on a semiconducting wafer, the method comprising:

depositing an ionic charge onto a surface of the patterned dielectric layer disposed on the semiconducting wafer with an ionic current sufficient to cause substantially a steady state condition;

measuring a voltage decay on the patterned dielectric surface as a function of time; and determining the thickness of the dielectric layer based upon the measured voltage decay, wherein the patterned dielectric layer includes at least one thick region of dielectric material and at least one thin region of dielectric material in which the thickness of the thick region is greater than the thin region.

31. The method of claim 30, wherein measuring the voltage decay includes using a non-contact probe.

32. The method of claim 30, wherein depositing the ionic charge on the surface of the patterned dielectric layer to cause a steady state condition includes generating a substantially equipotential surface between thick and thin regions of the patterned dielectric layer via electro-migration of the ionic charge.

33. The method of claim 30 further including terminating the deposition of ionic charge after causing the steady state condition, wherein the voltage decay is measured after terminating the deposition of ionic charge.

34. The method of claim 30, wherein the thin region of the patterned dielectric layer has a thickness of about 40 Å or less.

35. The method of claim 30, wherein the dielectric material of the thin region comprises a different material than the dielectric material of the thick region.

36. The method of claim 30, wherein the thin region comprises more than one dielectric material.

37. The method of claim 30, wherein the steady state condition results when the ionic current equals a leakage current flowing from the semiconducting wafer and across the thin region of the patterned dielectric layer.

38. The method of claim 30, wherein the step of determining the thickness of the dielectric layer includes determining an initial steady state surface potential, $V_0$, on the patterned dielectric layer from the measured voltage decay.

39. The method of claim 38, further including terminating the deposition of ionic charge after causing the steady state condition, wherein the initial surface potential is determined by extrapolating the measured voltage decay back to a time at which the deposition of ionic charge is terminated, i.e. the time t=0.

40. The method of claim 38, wherein the step of determining the thickness of the dielectric layer further includes using the initial steady state surface potential, $V_0$, in a linear expression to calculate an equivalent oxide thickness, T, of the dielectric layer, the linear expression given by the relationship $V_0 = aT + b$.

41. The method of claim 40, wherein the coefficients a and b in the linear expression are determined by a calibrating procedure.

42. The method of claim 41, wherein the calibrating procedure comprises depositing an ionic charge onto a plurality of semiconducting wafers each having a known dielectric layer thickness to generate an ionic current, $J_C$, recording a decay voltage on the plurality of semiconducting wafers, and determining from each measured voltage decay an initial surface potentials.

43. The method of claim 42, wherein depositing an ionic charge onto a surface of the patterned dielectric layer disposed on the semiconducting wafer with an ionic current sufficient to cause a steady state condition includes depositing a reduced ionic current given by the relationship $J_C/(1+S_{Thick}/S_{Thin})$, where $J_C$ is the ionic current generated in the calibrating procedure and $S_{Thick}/S_{Thin}$ is the ratio of the surface thick region surface area relative to the thin region surface area.

44. The method of claim 42, wherein each of the plurality of semiconducting wafers includes a patterned dielectric layer having thick and thin regions of dielectric material.

45. The method of claim 30, wherein the step of determining the thickness of the dielectric layer includes determining the surface potential on the dielectric surface at a time greater than t=0 from the measured voltage decay.

46. The method of claim 45, wherein the surface potential is determined at a time of about 1 second after t=0.

47. The method of claim 45, wherein the step of determining the thickness of the dielectric layer includes using the surface potential at a time greater than t=0, $V_D$, to calculate a dielectric thickness, T, via the expression $V_D = cT + d$, in which the coefficients c and d are derived from a calibrating procedure.

48. The method of claim 47, wherein the calibrating procedure includes measuring a voltage decay on a plurality of semiconducting wafers each having a known dielectric layer thickness, and determining from each measured voltage decay the surface potential, $V_D$, at the same time in the decay, the time being greater than t=0.

49. The method of claim 30, wherein the steps of depositing a charge onto a surface of the dielectric layer, measuring the voltage, $V_0$, and determining the thickness of the dielectric layer all occur in less than about 7 seconds.

50. The method of claim 47, wherein the steps of depositing a charge onto a surface of the dielectric layer, measuring the voltage, $V_D$, and determining the thickness of the dielectric layer all occur in less than about 7 seconds.

51. The method of claim 45, wherein the step of determining the thickness of the dielectric layer includes using the surface potential at a first time greater than t=0, $V_{D1}$, and a second time greater than t=0 and different than the first time, $V_{D2}$, to calculate a dielectric thickness, T.

52. The method of claim 51, wherein the surface potential at the second time is recorded at a time relative to t=0 that is larger than the surface potential recorded at the first time.

53. The method of claim 51, wherein T is determined via the expression $V_{D1} - V_{D2} = cT + d$, in which the coefficients c and d are derived from a calibrating procedure.

54. The method of claim 30, further including determining the capacitance of the dielectric layer deposited on the semiconducting wafer.

55. The method of claim 54, wherein the capacitance is obtained from the relationship
$C_{OX}=J_C/R$, where $J_C$ the ionic current at the steady state condition, R is the initial voltage decay rate, $dV/dt|_{t=0}$, derived from the measured voltage decay.

56. The method of claim 30, further including cleaning the patterned dielectric layer with a pre-cleaning solution prior to depositing the ionic charge onto the surface of the patterned dielectric layer.

57. The method of claim 30, further including depositing a precharging ionic charge on the patterned dielectric layer on a precharge area larger than an area for which the dielectric thickness is determined.

58. The method of claim 57, wherein the precharging ionic charge is of the same polarity as the charge deposited to achieve the steady state.

59. The method of claim 30 further including illuminating the patterned dielectric surface.

60. The method of claim 30 further including performing the steps of depositing ionic charge, measuring voltage decay, and determining the dielectric thickness on a plurality of measurement sites on the patterned dielectric layer.

61. The method of claim 30, wherein the ionic charge has a positive polarity.

62. The method of claim 30, wherein the ionic charge has a negative polarity.

* * * * *